United States Patent
Lee et al.

(10) Patent No.: US 6,851,184 B2
(45) Date of Patent: Feb. 8, 2005

(54) METHOD FOR MANUFACTURING A PRINTED CIRCUIT BOARD

(75) Inventors: Sung Gue Lee, Gyunggi-do (KR); Yong Il Kim, Incheon-si (KR); Yong Soon Jang, Osan-si (KR)

(73) Assignee: LG Electronics Inc., Seoul (KR)

( * ) Notice: Subject to any disclaimer, the term of this patent is extended or adjusted under 35 U.S.C. 154(b) by 253 days.

(21) Appl. No.: 10/174,956

(22) Filed: Jun. 20, 2002

(65) Prior Publication Data

US 2003/0014863 A1 Jan. 23, 2003

(30) Foreign Application Priority Data

Jul. 18, 2001 (KR) .................................... 2001-43221

(51) Int. Cl.$^7$ ................................................ H05K 3/02

(52) U.S. Cl. ........................ 29/847; 29/825; 29/830; 29/839; 29/840; 29/846; 29/852; 174/254; 174/255; 361/749; 361/779; 438/182

(58) Field of Search .................... 29/847, 825, 830, 29/839, 840, 846, 852; 174/254, 255; 361/749, 779; 438/182

(56) References Cited

U.S. PATENT DOCUMENTS 6,265,301 B1 * 7/2001 Lee et al. .................. 438/618
6,383,401 B1 * 5/2002 Labzentis et al. .......... 430/314
6,684,497 B2 * 2/2004 Appelt et al. ................ 29/852

* cited by examiner

Primary Examiner—Carl J. Arbes
Assistant Examiner—Tim Phan
(74) Attorney, Agent, or Firm—Fleshner & Kim, LLP

(57) ABSTRACT

A printed circuit board (PCB) and method of forming same is performed without incoming lines for plating. The plating is preferably performed on ball pad areas and/or bonding pad areas being the top layer of a multi-layer PCB. A metal layer that later forms circuit patterns serves to supply a power for plating ball pads for solder-ball bonding and bonding pads for wire-bonding with gold (Au). Thus, the gold (Au)-plating is performed prior to forming the circuit patterns. A positive-type first photoresist is coated on the metal layer to form the ball pads and the bonding pads. The coated first photoresist is also used to form circuit patterns. The gold (Au)-plated metal layer of ball pad areas and the bonding pad areas are protected by a second photoresist, which is reactive with a larger quantity of light than the first photoresist. Both first and second photoresists can be concurrently developed.

24 Claims, 6 Drawing Sheets

METHOD FOR MANUFACTURING A PRINTED CIRCUIT BOARD

BACKGROUND OF THE INVENTION

1. Field of the Invention

The present invention relates to a method for manufacturing a printed circuit board.

2. Background of the Related Art

FIG. 1 is a diagram that shows a plan view of a related art printed circuit board. As shown in FIG. 1, a printed circuit board 1 is cut along a dotted line to form one product portion 1'. The product portion 1' is used as a product.

A chip mounting area 2 is formed on the center of the product portion 1'. A semiconductor chip (not shown) is mounted on the chip mounting area 2 of the product portion 1'. A plurality of wire bonding pads 3 are formed along the perimeter of the chip mounting area 2. The wire bonding pads 3 are connected to the semiconductor chip by gold wires (not shown), thereby electrically connecting the semiconductor chip to the printed circuit board 1. The wire bonding pads 3 are exposed from the surface of the printed circuit board 1. The exposed surfaces of the wire bonding pads 3 are plated with gold (Au). The wire bonding pads 3 are electrically connected to circuit patterns (not shown) formed on the printed circuit board 1.

A plurality of ball pads 4 are formed on the printed circuit board 1. Solder balls (not shown) are attached to the ball pads 4 of the printed circuit board 1, thereby electrically connecting the printed circuit board 1 to an external substrate. The surfaces of the ball pads 4 are also plated with gold (Au), to improve adhesive strength of bonding between the ball pads 4 and the solder balls. The ball pads 4 are also electrically connected to the circuit pattern (not shown) formed on the printed circuit board 1. Therefore, the ball pads 4 are electrically connected to the wire bonding pads 3.

In order to plate the wire bonding pads 3 and the ball pads 4 with gold (Au), electric power should be supplied to the wire bonding pads 3 and the ball pads 4. Therefore, a main power supply line 6 for supplying power is disposed along the perimeter of the product portion 1' of the printed circuit board 1. The main power supply line 6 is shaped in a circuit pattern and has a predetermined width.

Sub power supply lines 5 are connected between the main power supply line 6 and the wire bonding pads 3 and the ball pads 4, respectively. The sub power supply lines 5 have a smaller width than that of the main power supply line 6. The sub power supply lines 5 serve to supply power to each of the wire bonding pads 3 and the ball pads 4. FIG. 1 shows a portion of the sub power supply lines 5, which are connected to the wire bonding pads 3 and the ball pads 4. Actually, the sub power supply lines 5 are connected to all (not shown) of the wire bonding pads 3 and the ball pads 4 one by one. The sub power supply lines 5 are electrically connected to the main power supply line 6 formed along the perimeter of the product portion 1'.

Therefore, when power is supplied to the main power supply line 6 to plate the wire bonding pads 3 and the ball pads 4 with gold (Au), the power is transmitted to the wire bonding pads 3 and the ball pads 4 via the sub power supply lines 5 connected to the main power supply line 6. Accordingly, the surfaces of the wire bonding pads 3 and the ball pads 4 are plated with gold (Au).

The main power supply line 6 and the sub power supply lines 5 are formed in a manufacturing process of the printed circuit board 1, and are shaped in circuit patterns. A guide hole 7 is for setting a position of the printed circuit board 1.

However, as described above the related art printed circuit board has various problems. As the semiconductor chip is highly integrated, many wire bonding pads 3 for electrically connecting the semiconductor chip to the printed circuit board 1 are required, and many ball pads 4 for electrically connecting the printed circuit board 1 to the external substrate are required. Further, as the semiconductor product is miniaturized, a small-sized printed circuit board is required. To reduce the size of the printed circuit board, the wire bonding pads 3 and the ball pads 4 should be finely disposed, and the sub power supply lines 5 connected to the wire bonding pads 3 and the ball pads 4 should be finely and exactly designed.

The sub power supply lines 5 pass between the wire bonding pads 3 and the ball pads 4, and then are connected to the corresponding one of the wire bonding pads 3 and the ball pads 4. After the gold (Au)-plating process or further process, the printed circuit board 1 is cut along the dotted line, thereby forming the product portion 1'. The product portion 1' is used as a product.

However, after cutting the printed circuit board 1, portions of the sub power supply lines 5 are left on the product portion 1'. As the semiconductor chip is highly integrated and is operated at high-frequencies, signals from the semiconductor chip flow along the portions of the sub power supply lines 5 that remain on the product portion 1' to cause the interference with neighboring remaining sub power supply lines 5 and decrease the performance of the semiconductor product.

To solve such a problem, an edge back technique for removing the left behind sub power supply lines 5 has been introduced. In the edge back technique, the sub power supply lines 5 are coated with a gold-plating resist. The wire bonding pads 3 and the ball pads 4 are plated with gold (Au). Then, the gold-plating resist is removed from the sub power supply lines 5, thereby exposing the sub incoming lines 5. Next, the exposed sub power supply lines 5 are removed using an alkali etching solution.

However, in order to prevent the wire bonding pads 3 and the ball pads 4 from being removed by the etching solution together with the sub power supply lines 5, connection parts of the sub power supply lines 5 with the wire bonding pads 3 and the ball pads 4 having a prescribed length are still left behind. Further, since a photoresist is used as the gold-plating resist, it is difficult to coat the photoresist exactly on the sub power supply lines 5 because of a positional deviation of the resist. Further, it is difficult to adhere the photoresist closely to the sub incoming lines 5 because of a weak adhesive strength of the resist. Therefore, the sub power supply lines 5 are not entirely removed. Alternatively, a full body plating method has been introduced. However, since the full body plating method damages the circuit patterns formed on the printed circuit board 1, it is difficult to form fine circuit patterns. Thus, there exists a need to provide electric power for plating ball pads and bonding pads of a printed circuit board.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention to provide a method for manufacturing a printed circuit board that reduces an incidence of subpower lines for plating remaining upon completion of a printed circuit board product.

Another object of the present invention to provide a method for manufacturing a printed circuit board, that increases density of the circuit patterns formed on the printed circuit board.

Another object of the present invention is to provide a method for manufacturing a printed circuit board that improves the reliability of a product formed using the printed circuit board.

Another object of the present invention is to provide a method for manufacturing a printed circuit board that uses first and second resists of different characteristics.

Another object of the present invention is to provide a method for manufacturing a printed circuit board that uses first and second resists of different characteristics to substantially remove power supply lines used in plating wire and/or bond pads.

Another object of the present invention is to provide a method for manufacturing a printed circuit board, that does not require tie bars for supplying power to wire bonding pads and/or ball pads in plating the wire bonding pads and the ball pads with gold (Au) to improve adhesive strength of wire bonding or solder ball bonding or to improve electrical conduction to increase density of circuit patterns formed on the printed circuit board.

In order to achieve at least, the above and other objects in a whole or in parts in, there is provided a method for manufacturing a printed circuit board that includes coating a first photoresist on a metal layer formed on a substrate, removing portions of the first photoresist to expose at least one of ball pad areas and bonding pad areas of the metal layer, forming a plating layer on the exposed metal layer of the at least one ball pad areas and the bonding pad areas using the metal layer, coating a second photoresist on the plating layer, the second photoresist being reactive with a second quantity of light differing from a first quantity of light reactive with the first photoresist, irradiating a designated quantity of light to both the first photoresist and the second photoresist, wherein the designated quantity of light is reactive with the first photoresist but not reactive with the second photoresist, and developing the first photoresist and the second photoresist, to expose the metal layer except for circuit pattern areas, and forming circuit patterns by removing the exposed metal layer.

To further achieve the above objects in a whole or in part in accordance with present invention, there is provided a method for manufacturing a printed circuit board that includes exposing ball pad areas and/or bonding pad areas of a metal layer formed on a substrate, plating the exposed ball pad areas and/or the exposed bonding pad areas of the metal layer, and forming circuit patterns on the substrate by selectively removing the metal layer.

To further achieve the above objects in a whole or in part and in accordance with the present invention, there is provided a method for manufacturing a printed circuit board that includes coating a first resist on a conductive layer formed on a substrate and exposing the conductive layer over connection pad areas, plating the exposed conductive layer of the connection pad areas with gold (Au), coating a second resist on the gold (Au)-plated layer, wherein the first and second resists have different characteristics, and wherein a first etching material reacts with the first resist and does not react with the second resist, etching with the first etching material to remove the first resist on areas of the conductive layer except for circuit pattern areas, and the connection pad areas, and forming circuit patterns on the exposed conductive layer using remaining portions of the first resist and the second resist on the circuit pattern areas and the connection pad areas as a resist.

To further achieve the above objects in a whole or in part and in accordance with the present invention, there is provided a method for manufacturing a printed circuit board that includes exposing ball pad areas and bonding pad areas of a metal layer formed on a substrate, plating the exposed ball pad areas and the exposed bonding pad areas of the metal layer, forming circuit patterns on the substrate by selectively removing the metal layer and forming the ball pad areas and the bonding pad areas of the metal layer, wherein the forming includes coating a positive-type first photoresist and selectively exposing and developing the first photoresist, wherein remaining portions of the first photoresist are on areas of the metal layer other than the ball pad areas and the bonding pad areas, wherein the forming the circuit patterns include coating a second photoresist on the plated ball pad areas and the plated bonding pad areas, the second photoresist being reactive with a larger quantity of light than the first photoresist, irradiating a third quantity light, which is reactive with the first photoresist but is not reactive with the second photoresist, on both the first and second photoresists to remove the remaining portions of the first photoresist on the metal layer except for circuit pattern areas, and removing the exposed metal layer using the first photoresist and the second photoresist, left on the circuit pattern areas, the ball pad areas and the bonding pad areas, as a resist.

To further achieve the above objects in a whole or in part and in accordance with the present invention, there is provided a method for manufacturing a printed circuit board, the method including coating a first photoresist on a metal layer formed on a substrate, removing portions of the first photoresist to access at least one member chosen from ball pad areas and bonding pad areas of the metal layer, forming a plating layer on the accessed metal layer of the at least one member chosen from the ball pad areas and the bonding pad areas using the metal layer, patterning a second photoresist on the plating layer, wherein reactions of the first photoresist and the second photoresist each vary according to a quantity of light while being exposed, wherein one of said second photoresist or the first photoresist reacts with a higher quantity of light that the other of the first photoresist or the second photoresist, exposing the first and second photoresists with an adjusted amount of irradiated light so that the exposed first photoresist reacts and is removed and the second photoresist does not react when developing both the exposed first and second photoresists to access the metal layer except for circuit pattern areas after exposure to the adjusted amount of irradiated light, and forming circuit patterns by removing the accessed metal layer.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
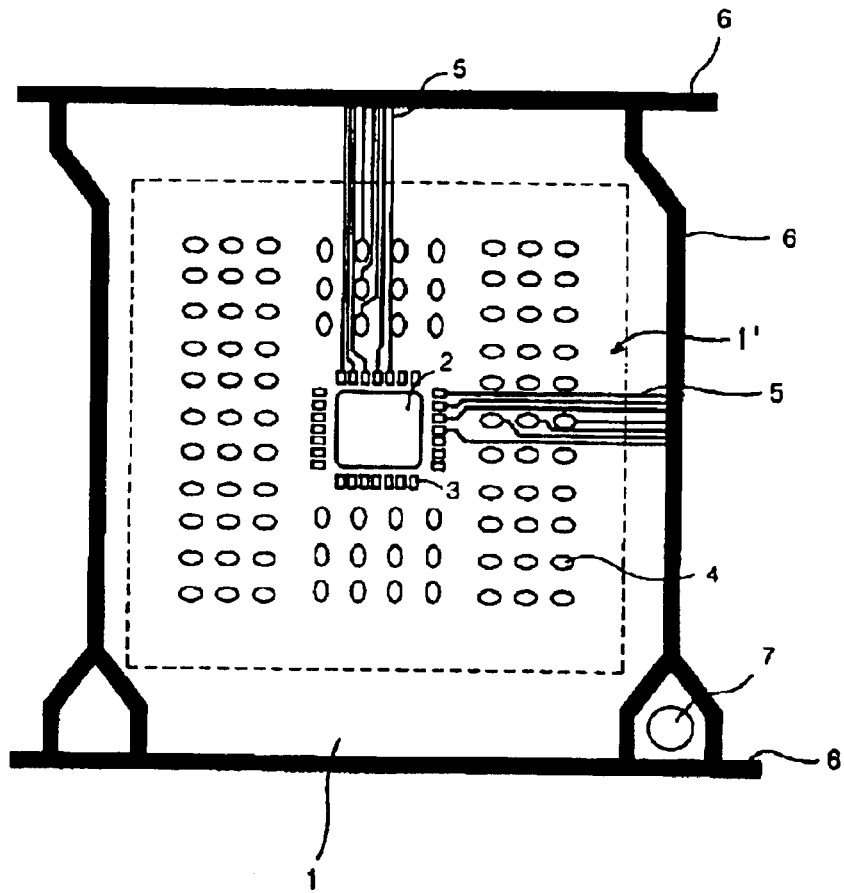
FIG. 1 is a diagram that shows a plan view of a related art printed circuit board.
Figure 2A:
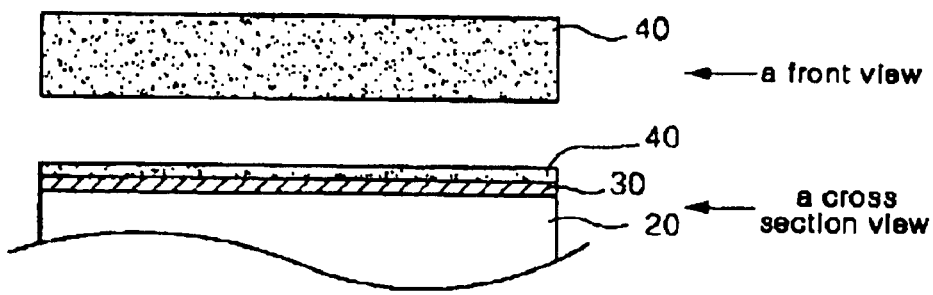
FIGS. 2a to 2j are diagrams that show plan and cross-sectional views illustrating a preferred embodiment of a manufacturing method of a printed circuit board in accordance with the present invention.

Preferred embodiment of a manufacturing method of a printed circuit board in accordance with the present invention will now be described. As shown in FIG. 2a, a metal layer, preferably a copper layer 30, which is a conductor layer, is formed on a substrate 20 that is a base material. Then, a first photoresist 40 is coated on the copper layer 30 of the substrate 20. Through holes (not shown) for interconnecting multiple layers of the substrate 20 are formed on the metal layer 30 and the substrate 20. When the substrate 20 is multi-layered, circuit patterns are preferably not formed on the uppermost layer of the substrate 20.

The first photoresist 40 is preferably a positive type. In the positive-type photoresist, portions that are exposed to light are soluble to an etching process and easily removed. By using the positive-type first photoresist 40, the copper layer 30 is selectively exposed. That is, the first photoresist 40 over ball pad areas and/or wire bonding pad areas is exposed to light and developed. Then, the first photoresist 40 of the ball pad areas and/or the wire bonding pad areas is removed to expose the copper layer 30. The exposed copper layer 30 of the ball pad areas and/or the wire bonding pad areas is plated, preferably with gold (Au). The first photoresist 40 on areas other than the ball pad areas and/or the wire bonding pad areas, i.e., the remaining or left behind portions of the first photoresist 40, can preferably be used as a resist in a further step for forming circuit patterns on the substrate 20.

Figure 2B:
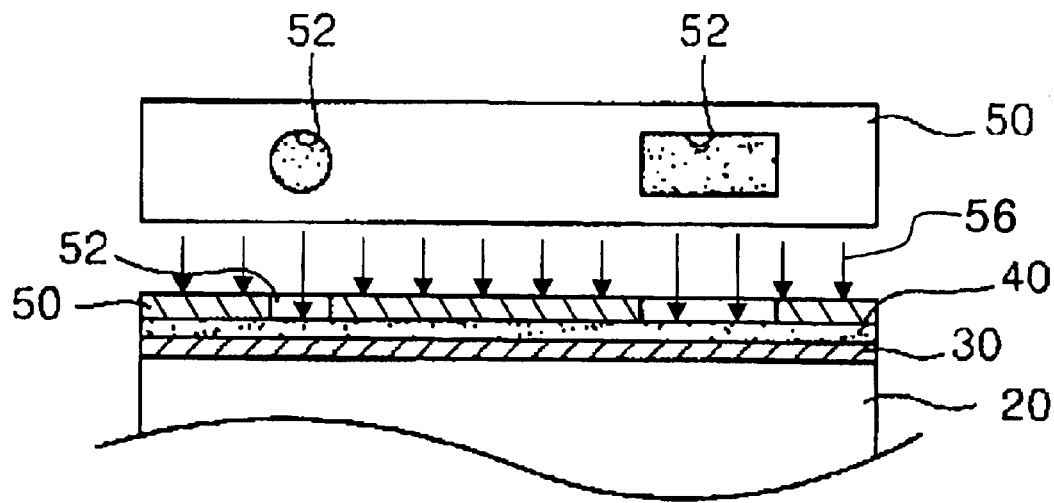

As shown in FIG. 2b, an exposure film 50 is formed on the first photoresist 40. The exposure film 50 includes exposure windows 52. Since the exposure windows 52 serve to expose the ball pad areas and the wire bonding pad areas, the exposure windows 52 correspond to the ball pad areas and the wire bonding pad areas.

Figure 2C:
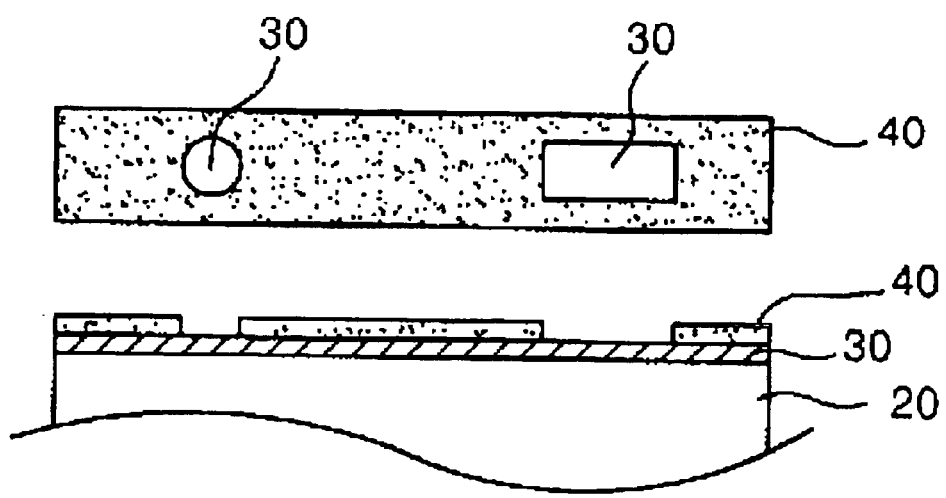

The first photoresist 40 is preferably removed using the exposure film 50 or the like having the exposure windows 52. That is, the portions of the first photoresist 40, which correspond to the exposure windows 52 of the exposure film 50, are exposed to light, reacted with the light beam 56, and removed by etching to expose the copper layer 30, as shown in FIG. 2c.

Figure 2D:
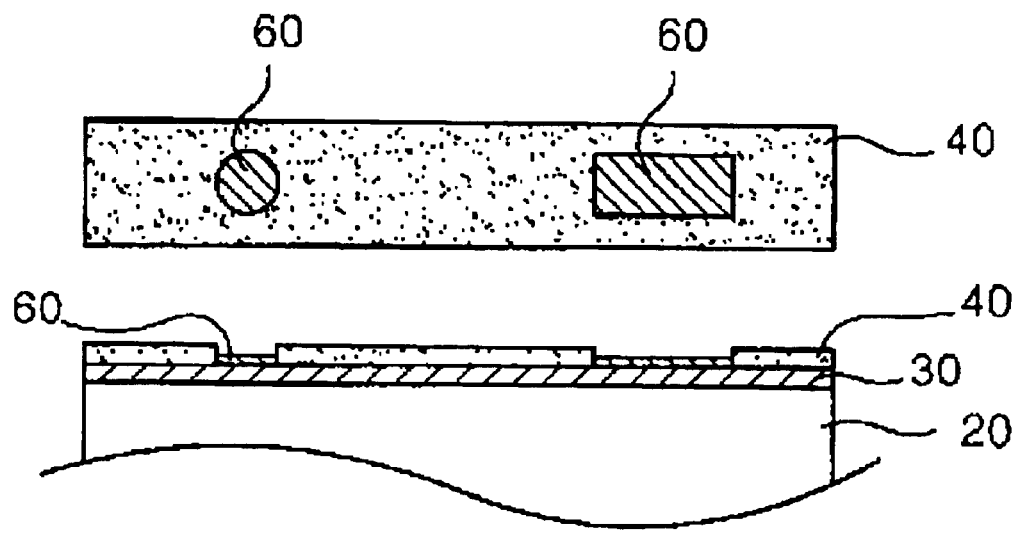

Then, the copper layer 30 is preferably coupled to an electrode or the like for connection to electric power, to form a gold (Au)-plating layer 60 on the exposed copper layers 30, as shown in FIG. 2d. The gold (Au)-plating layer 60 preferably includes a nickel (Ni) layer, which is formed on the exposed metal layer 30, and a gold (Au) layer, which is formed on the nickel (Ni) layer.

Figure 2E:
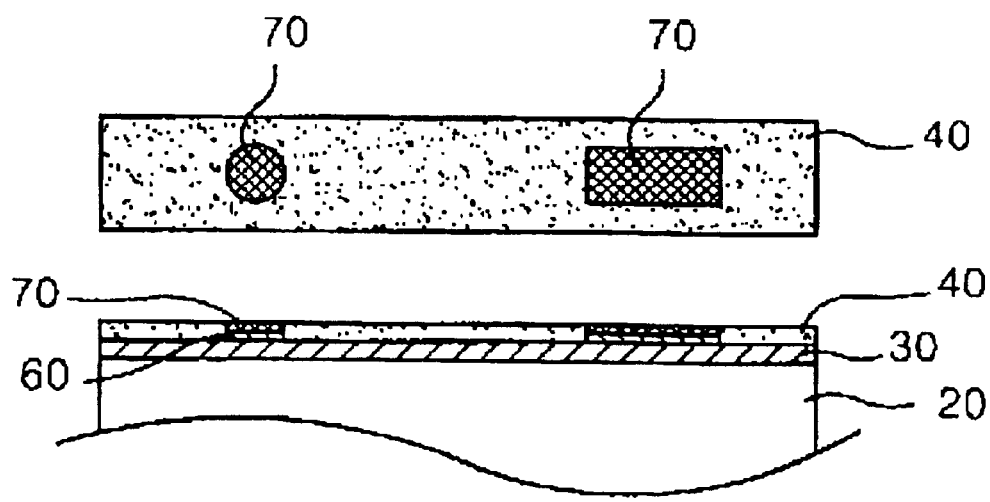

A second photoresist 70 is preferably selectively coated on the gold (Au)-plating layer 60. The second photoresist 70 is also preferably a positive type that requires a larger quantity of light than the first photoresist 40 to be exposed. FIG. 2e shows the second photoresist 70 coated on the gold (Au)-plating layer 60 of the ball pad areas and the bonding pad areas.

An exposure film 50' is aligned on the first photoresist 40 and the second photoresist 70. The exposure film 50' includes exposure windows 52'. Since the exposure windows 52' serve to expose the circuit patterns formed on the substrate 20, the exposure windows 52' preferably correspond to areas except for a first area 53 formed on the first photoresist 40 and a second area 54 formed on the second photoresist 70.

Figure 2F:
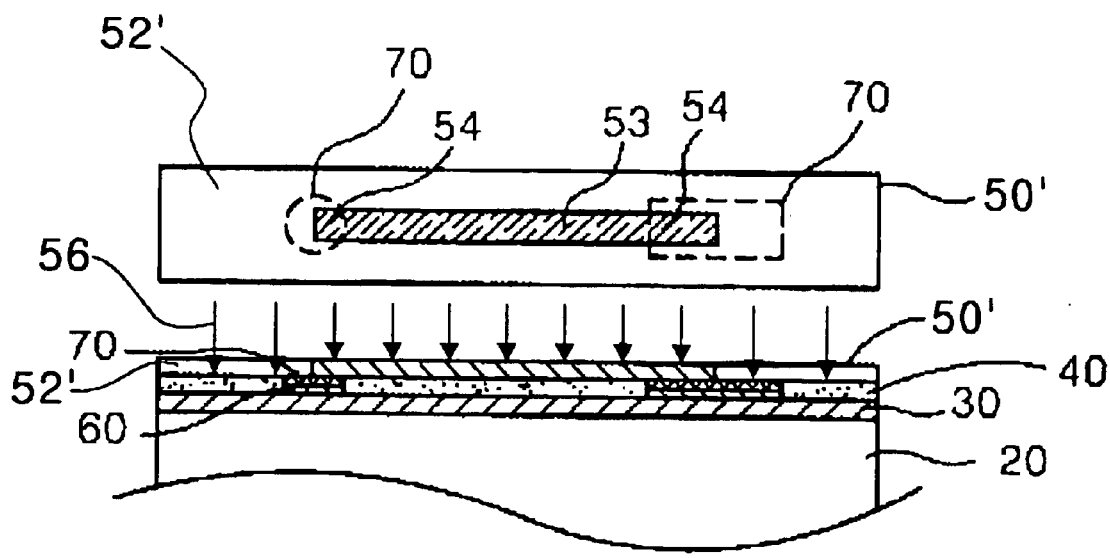

That is, the first area 53 and the second area 54 are sheltered from light. Preferably, an end of the first area 53 is extended to the second photoresist area and is overlapped with the second area 54 so that the first photoresist 40 is exposed to light even when the exposure film 50' is misaligned and not exactly coated on the first photoresist 40 and the second photoresist 70. FIG. 2f shows the exposure film 50' coated on the first photoresist 40 and the second photoresist 70.

Those skilled in the art will appreciate that the positions of the exposure windows 52' of the exposure film 50' are not limited thereto. That is, the positions of the exposure windows 52' of the exposure film 50' may be variously modified.

Light is irradiated to the first photoresist 40 and the second photoresist 70 through the exposure windows 52' of the exposure film 50' in an exposing step. At this time, the light is irradiated in a designated quantity, which is reactive with the first photoresist 40 but not reactive with the second photoresist 70.

Figure 2G:
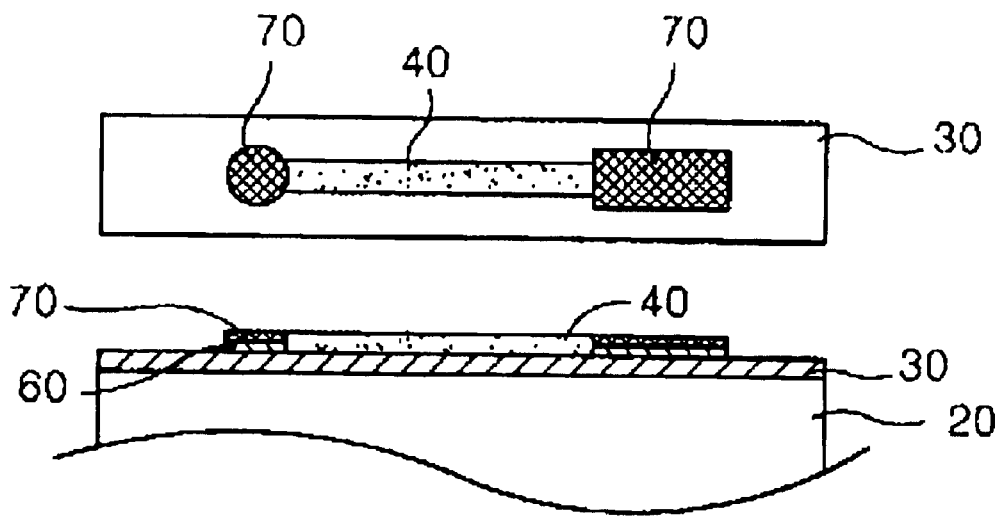

After the exposing step, the first photoresist 40 and the second photoresist 70 are developed. By going through such exposing and developing steps, the exposed portions of the first photoresist 40 are removed. However, the second photoresist 70 is not reactive with this quantity of the irradiated light. Therefore, as shown in FIG. 2g, the metal layer 30 corresponding to the exposed portions of the first photoresist 40 is exposed.

That is, although the second photoresist 70 is exposed to the irradiated light, since the second photoresist 70 is not reactive with this quantity of the irradiated light, the second photoresist 70 is not removed. Therefore, the ball pad areas, the bonding pad areas, and the circuit pattern areas are more stably and exactly formed.

Of course, the first photoresist 40 and the second photoresist 70 below the exposure film 50' except for the exposure windows 52' are not removed. Therefore, the first photoresist 40 of the first area 53 and the second photoresist 70 of the second area 54 are not removed.

Figure 2H:
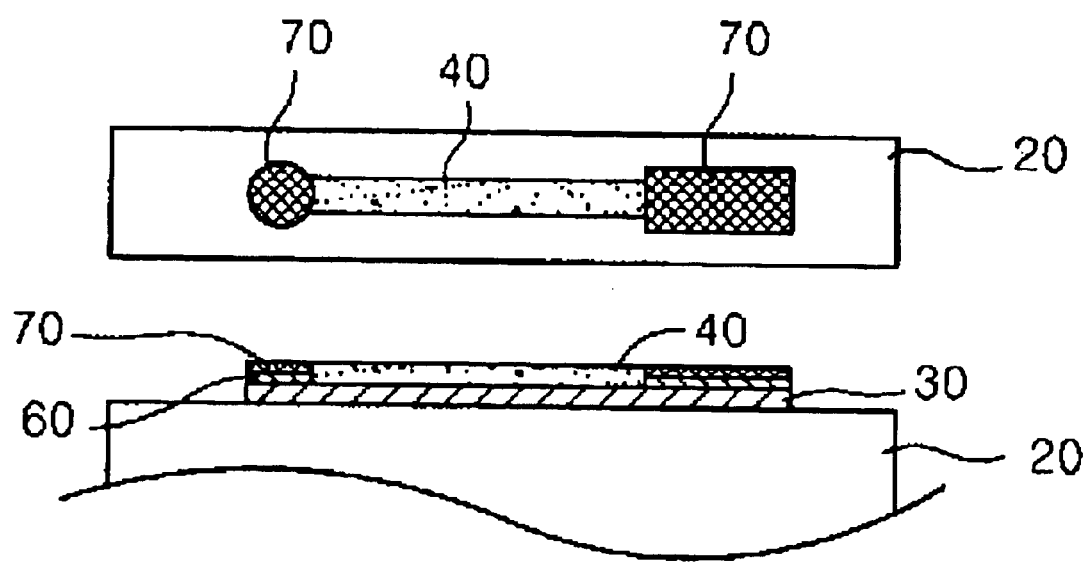

Next, a removing step or an etching is performed. An etching solution is not permeated into the first photoresist 40 and the second photoresist 70. Therefore, the metal layer 30 below the first photoresist 40 and the second photoresist 70 is left, but the exposed copper layer 30 is etched out with the etching solution. FIG. 2h shows the substrate 20, in which the exposed metal layer 30 is etched out.

Figure 2I:
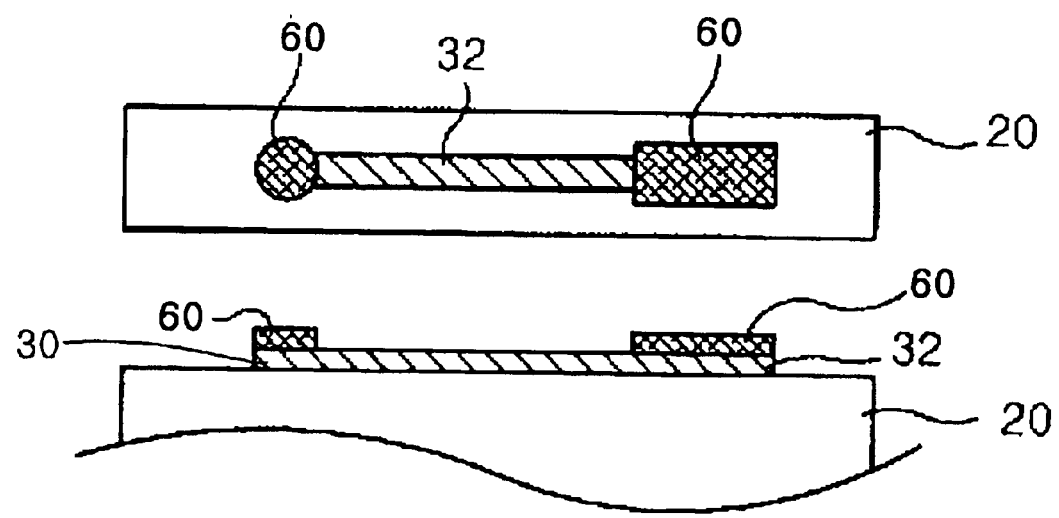

As shown in FIG. 2i, the circuit patterns 32, the gold (Au)-plated ball pad areas, and the gold (Au)-plated wire bonding pad areas are formed by preferably peeling off the first photoresist 40 and the second photoresist 70. Herein, the circuit patterns 32 are formed using the conductive or copper layer 30. The gold (Au)-plated ball pad areas and the gold (Au)-plated bonding pad areas show the gold (Au) plating layer 60.

Figure 2J:
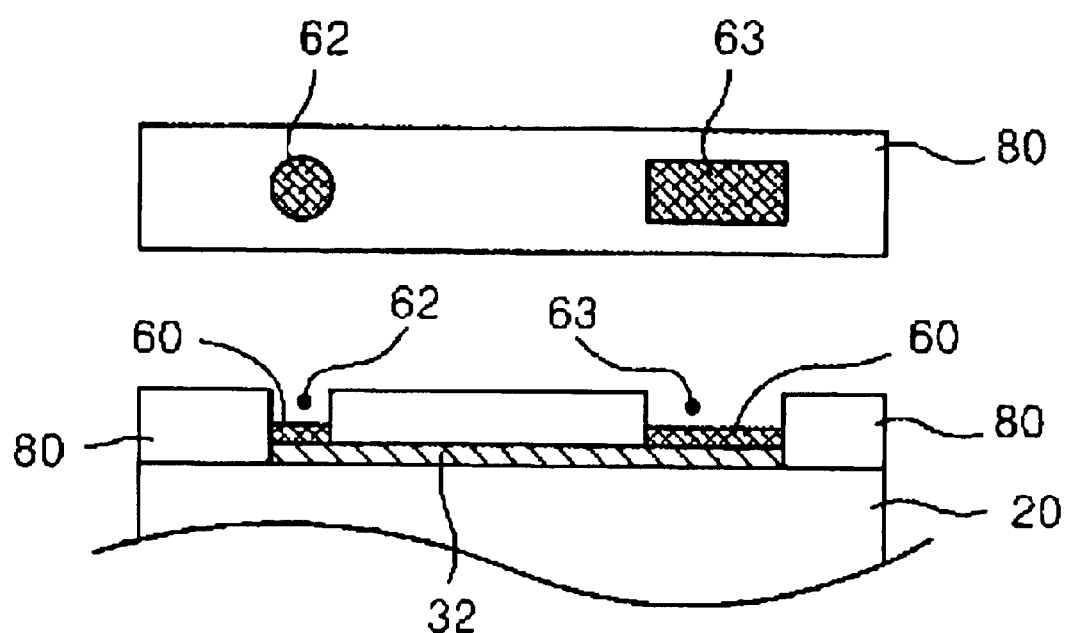

After forming the circuit pattern or patterns 32, a finishing layer or a photo solder resist 80 is preferably coated on the substrate 20 to improve an insulation characteristic of the circuit patterns 32 and to protect the circuit patterns 32 from damages such as a short between the neighboring circuit patterns 32. After developing and curing the photo solder resist 80, wire bonding pads 63 for wire-bonding and ball bonding pads 62 for solder ball-bonding are formed. FIG. 2j shows the wire bonding pads 63 and the ball bonding pads 62.

Operations of a preferred embodiment of a printed circuit board manufactured by the method described above in accordance with the present invention will now be described. The gold (Au)-plating layer 60 is formed on the ball pads 62 and the bonding pads 63 prior to forming the circuit patterns 32 on the uppermost layer of the substrate 20. That is, the copper layer 30 is formed on the uppermost layer of the substrate 20 and the positive-type first photoresist 40 is coated. Then, the first photoresist 40 of the ball pad areas and the bonding pad areas is exposed to light and removed to expose the copper layer 30 of the ball pad areas and the bonding pad areas.

The copper layer 30 is coupled to an electrode, thereby forming the gold (Au)-plating layer 60 on the exposed metal layer 30. The positive-type second photoresist 70, which reacts with a larger quantity of light than the first photoresist 40, is coated on the gold (Au)-plating layer 60. Among some remaining portions of the first photoresist 40, areas other than the circuit pattern areas are exposed to light and removed. However, the quantity of light for exposing the first photoresist 40 is not sufficient to react with the second photoresist 70. Therefore, the ball pads 62 and the wire bonding pads 63 can be more exactly formed.

Accordingly, the copper layer 30 except for the circuit pattern areas, the ball pad areas, and the wire bonding pad areas is removed. Therefore, the substrate 20 according to preferred embodiments of the present invention does not require the related art incoming power sub supply lines for gold (Au)-plating. Preferably, the substrate with the metal layer formed thereon may be multi-layered, and through holes or the like for electrically interconnecting the inner layers may be formed on the metal layer and the substrate. In accordance with the preferred embodiments, the gold (Au)-plating layer is formed on the ball pads and the bonding pads prior to forming the circuit patterns. In forming the circuit patterns, the unnecessary portions of the metal layer are all removed. Therefore, unnecessary elements are not formed on the printed circuit board, thereby increasing the density of circuit patterns, preventing the noise and the delay of signal transmission, and improving the performance of the printed circuit board. Preferred embodiments according to the present invention can increase the density of the circuit patterns formed on the printed circuit board. Further, the printed circuit board according to the preferred embodiments do not require unnecessary elements such as the incoming lines for plating, thereby improving the performance of the printed circuit board, for example, reducing the effect of carrier wave to the high frequency.

In addition, preferred embodiments of a printed circuit board and methods of manufacturing the same according to the present invention were described using the first photoresist 40 and the second photoresist 70 that are reactive to light of different characteristics for selective removal. However, the present invention is not intended to be so limited as an alternative plurality of resist layers with different characteristics could be used.

As described above, preferred embodiments of a printed circuit board and methods of manufacturing the same according to the present invention have various advantages. The preferred embodiments provide a method for manufacturing a printed circuit board, in which the preferably gold (Au)-plating layer is formed on the ball pads and the bonding pads prior to forming the circuit patterns or top layer circuit patterns in a multi-layer printed circuit board, and the unnecessary portions of the metal layer are more completely or all removed. Thus, preferred embodiments of a printed circuit board according to the present invention increases or maximizes the performance, increases the density of the circuit patterns formed on the printed circuit board, and improves the reliability of a product formed by using the printed circuit board.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for manufacturing a printed circuit board, said method comprising:

coating a first photoresist on a metal layer formed on a substrate;

removing portions of the first photoresist to expose at least one of ball pad areas or bonding pad areas of the metal layer;

forming a plating layer on the exposed metal layer of the at least one of the ball pad areas or the bonding pad areas using the metal layer;

coating a second photoresist on the plating layer, said second photoresist being reactive with a second quantity of light differing from a first quantity of light reactive with the first photoresist;

irradiating a designated quantity of light to both the first photoresist and the second photoresist, wherein the designated quantity of light is reactive with the first photoresist but not reactive with the second photoresist, and developing the first photoresist and the second photoresist, to expose the metal layer except for circuit pattern areas; and forming circuit patterns by removing the exposed metal layer.

2. The method for manufacturing the printed circuit board of claim 1, wherein said first photoresist is a positive type in which exposed portions are removed by developing.

3. The method for manufacturing the printed circuit board of claim 1, further comprising coating a photo solder resist to protect the circuit patterns and exposing the at least one of the bonding pad areas and the ball pad areas to form at least one of bonding pads and ball pads.

4. The method for manufacturing the printed circuit board of claim 1, wherein the forming the plating layer on the exposed metal layer of the at least one of the ball pad areas and the bonding pad areas is performed by plating with gold (Au).

5. The method for manufacturing the printed circuit board of claim 1, wherein the second photoresist is reactive with a larger quantity of light than the first photoresist.

6. The method of claim 5, wherein the reactions of the first photoresist and the second photoresist each vary according to said irradiated quantity of light while being exposed.

7. The method of manufacturing the printed circuit board of claim 1, comprising coating a protective layer on the circuit patterns.

8. The method for manufacturing the preferred circuit board of claim 1, wherein in the forming the plating layer, the metal layer is used to supply sufficient electric power to the at least one of the ball pad areas and the bonding pad areas.

9. The method of claim 1, wherein said forming circuit patterns by removing the exposed metal layer comprises removing the exposed metal layer using remaining portions of the first photoresist and the second photoresist left on the circuit pattern areas, as a resist.

10. The method of claim 1, comprising patterning an exposure layer on the first and second photoresist.

11. The method of claim 1, wherein the reactions of the first photoresist and the second photoresist each vary according to a quantity of light while being exposed.

12. A method for manufacturing a printed circuit board, comprising:
   exposing ball pad areas and bonding pad areas of a metal layer formed on a substrate;
   plating the exposed ball pad areas and the exposed bonding pad areas of the metal layer;
   forming circuit patterns on the substrate by selectively removing the metal layer; and
   forming the ball pad areas and the bonding pad areas of the metal layer, wherein the forming comprises,
      coating a positive-type first photoresist, and
      selectively exposing and developing the first photoresist, wherein remaining portions of the first photoresist are on areas of the metal layer other than the ball pad areas and the bonding pad areas, wherein the forming the circuit patterns comprises,
      coating a second photoresist on the plated ball pad areas and the plated bonding pad areas, said second photoresist being reactive with a larger quantity of light than the first photoresist;
      irradiating a third quantity light, which is reactive with the first photoresist but is not reactive with the second phororesist, on both the first and second photoresists to remove the remaining portions of the first photoresist on the metal layer except for circuit pattern areas, and
      removing the exposed metal layer using the first photoresist and the second photoresist, left on the circuit pattern areas, the ball pad areas and the bonding pad areas, as a resist.

13. The method for manufacturing the printed circuit board of claim 12, comprising:
   coating a protective sealing layer over the circuit patterns; and
   selectively removing the sealing layer to expose plated ball pads and plated bonding pads.

14. The method for manufacturing the printed circuit board of claim 13, wherein the substrate with the metal layer formed thereon is multi-layered, and through holes for electrically interconnecting inner layers are formed on the metal layer and the substrate.

15. The method for manufacturing the printed circuit board of claim 12, comprising patterning an exposure layer on the second photoresist.

16. The method for manufacturing the printed circuit board of claim 12, further comprising:
   coating a photo solder resist to protect the circuit patterns; and
   exposing the bonding pad areas and the ball pad areas in the photo solder resist to form bonding pads and ball pads.

17. A method for manufacturing a printed circuit board, said method comprising:
   coating a first resist on a conductive layer formed on a substrate and exposing the conductive layer over connection pad areas;
   plating the exposed conductive layer of the connection pad areas;
   coating a second resist on the plated layer, wherein the first and second resists have different characteristics, and wherein a first etching material reacts with the first resist and does not react with the second resist;
   etching the exposed first resist and the second resist with the first etching material to leave the second resist and remove the first resist on areas of the conductive layer except for circuit pattern areas, and the connection pad areas; and
   forming circuit patterns on the exposed conductive layer using remaining portions of the first resist and the second resist, on the circuit pattern areas and the connection pad areas, as a resist.

18. The method of claim 17, wherein the first and second resists are photoresists, and wherein said second photoresist reacts with a second larger quantity of light than a first quantity of light that reacts with the first photoresist.

19. The method of claim 17, wherein the connection pad areas are one of ball pad areas and bonding pad areas of the conductive layer and are formed by coating a positive-type first photoresist as the first resist and-selectively exposing and developing the first photoresist so that the first photoresist over areas of the conductive layer other than said one of the ball pad areas and the bonding pad areas is left.

20. The method of claim 17, wherein after forming the circuit patterns, a photo solder resist is coated to protect the circuit patterns, wherein the connection pad areas are one of bonding pad areas and ball pad areas, and wherein the connection pad areas are exposed to form one of bonding pads and ball pads.

21. The method claim 17, comprising patterning an exposure layer on the second resist, wherein the second resist is also coated on the circuit patterns.

22. The method of claim 17, wherein said forming circuit patterns on the exposed conductive layer comprises removing said exposed conductive layer using said remaining portions of the first resist and the second resist, as the resist.

23. The method of claim 17, wherein reactions of the first and second photoresist vary according to a prescribed relationship to the composition or amount of said etching material while being etched.

24. A method for manufacturing a printed circuit board, said method comprising:
   coating a first photoresist on a metal layer formed on a substrate;
   removing portions of the first photoresist to access at least one member chosen from ball pad areas and bonding pad areas of the metal layer;
   forming a plating layer on the accessed metal layer of the at least one member chosen from the ball pad areas and the bonding pad areas using the metal layer;
   patterning a second photoresist on the plating layer, wherein reactions of the first photoresist and the second photoresist each vary according to a quantity of light while being exposed, wherein one of said second photoresist or said first photoresist reacts with a higher quantity of light than said other of the first photoresist or the second photoresist;
   exposing the first and second photoresists with an adjusted amount of irradiated light so that the exposed first photoresist reacts and is removed and the second photoresist does not react when developing both the exposed first and second photoresists to access the metal layer except for circuit pattern areas after exposure to the adjusted amount of irradiated light; and
   forming circuit patterns by removing the accessed metal layer.

* * * * *